United States Patent
Pinnow et al.

(10) Patent No.: US 7,483,293 B2
(45) Date of Patent: Jan. 27, 2009

(54) METHOD FOR IMPROVING THE THERMAL CHARACTERISTICS OF SEMICONDUCTOR MEMORY CELLS

(75) Inventors: Cay-Uwe Pinnow, Munich (DE); Klaus-Dieter Ufert, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 367 days.

(21) Appl. No.: 11/261,212

(22) Filed: Oct. 28, 2005

(65) Prior Publication Data

US 2006/0109708 A1    May 25, 2006

(30) Foreign Application Priority Data

Oct. 29, 2004   (DE)   .................. 10 2004 052 647

(51) Int. Cl.
    *G11C 11/00*   (2006.01)
(52) U.S. Cl. ........................ 365/163; 365/148
(58) Field of Classification Search ............. 365/148, 365/153, 163
    See application file for complete search history.

(56) References Cited

U.S. PATENT DOCUMENTS 6,487,106 B1 *  11/2002  Kozicki ................... 365/153
2003/0168651 A1   9/2003  Kozicki
2004/0124406 A1   7/2004  Campbell et al.

FOREIGN PATENT DOCUMENTS

WO       02/21542     3/2002
WO       03/071614    8/2003

OTHER PUBLICATIONS

A. Urena et al., "Influence of Cu addition in the crystallization of the superionic glass $(Ge_{25}Se_{75})_{75}AG_{25}$,", Journal of Non-Crystalline Solids (2002) pp. 306-314.

* cited by examiner

*Primary Examiner*—Richard Elms
*Assistant Examiner*—Harry W Byrne
(74) *Attorney, Agent, or Firm*—Dicke, Billig & Czaja, PLLC

(57) ABSTRACT

A non-volatile, resistively switching memory cell includes a first electrode, a second electrode and a solid electrolyte, which is arranged such that it makes contact between the electrodes, and is composed of an amorphous or partially amorphous, non-oxidic matrix and a metal which is distributed in the amorphous or partially amorphous, non-oxidic matrix and whose cations migrate to the cathode in the amorphous or partially amorphous, non-oxidic matrix under the influence of an electrical voltage, wherein the solid electrolyte contains one or more further metallic materials for stabilization of the amorphous state of the matrix.

19 Claims, 1 Drawing Sheet

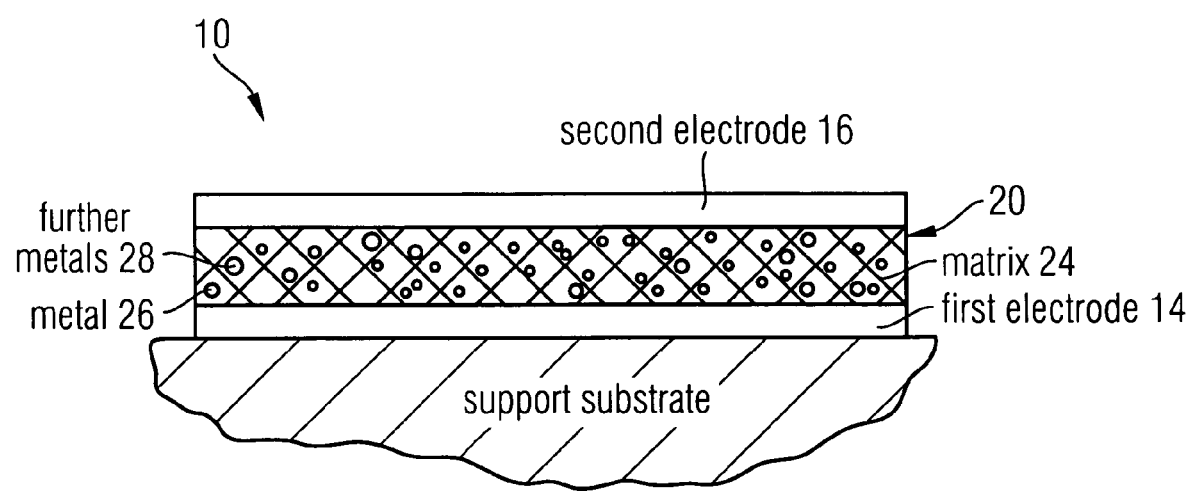

METHOD FOR IMPROVING THE THERMAL CHARACTERISTICS OF SEMICONDUCTOR MEMORY CELLS

CROSS-REFERENCE TO RELATED APPLICATIONS

This Utility Patent Application claims priority to German Patent Application No. DE 10 2004 052 647.8, filed on Oct. 29, 2004, which is incorporated herein by reference.

FIELD OF THE INVENTION

The present invention relates to non-volatile, resistively switching memory cells.

BACKGROUND

Since the start of the development of electronic components and integrated circuits, the semiconductor industry has been continuously concerned with the task of increasing the integration density and for this purpose, inter alia, reducing the size of memory cells to an ever greater extent. These efforts to miniaturize electronic components, such as memory cells, are increasingly reaching the physical limits of the materials used, and the principle of information storage.

In the case of dynamic RAM (DRAM), the volatility of the information storage represents a major problem. The charge which is stored in the capacitor and thus the stored information must be refreshed periodically, and this is normally done at intervals of a few milliseconds. In the case of static RAM (SRAM), in contrast, no signals need be produced for refreshing (apart from the operating voltage) in order to maintain the data. SRAM memories can also be integrated in a chip. One disadvantage of SRAM memories in comparison to DRAM is that they require a large area. A further disadvantage is that SRAM store data only for as long as the operating voltage is applied. Like DRAM, SRAM is thus a volatile memory medium.

This volatility problem has been approached by the development of various technologies, such as the development of FRAM, MRAM and, in particular, flash memory cells, in which a charged floating gate is used for information storage. FRAM, MRAM and flash memory cells represent RAM types which are non-volatile.

DRAM and flash memory cells are subject to the further problem that, as the miniaturization of the memory cells progresses, the amount of charge which can be kept in a cell also becomes ever smaller (in this context, see, inter alia "Can Solid State Electrochemistry Eliminate the Memory Scaling Quandary?", M. N. Kozicki, M. Mitkova, J. Zhu, M. Park, C. Gopalan, Proc. VLSI (2002)). However, the reliability of information storage decreases as the amount of charge falls. Memory cells which are based on capacitive charging no longer operate satisfactorily in this "low-energy" range owing to the lower voltages and current levels resulting from the miniaturization.

These and other problems have led to the development of new memory technologies in recent years, which are based on concepts other than capacitive charging. In this case, the non-volatile CBRAM memory cells, which have been mentioned further above and on which the memory cells according to the present invention are based, have been found to be highly promising.

CBRAM memory cells comprise two electrodes and a thin layer composed of a solid electrolyte, which is arranged such that it makes contact between the two electrodes. The solid electrolyte contains a metal. The solid electrolyte and the metal together form a solid solution. When a sufficiently high electrical voltage is applied to the memory cell, the dissolved metal forms cations which migrate to the cathode through the solid electrolyte under the influence of the electrical field, in order to be deposited there as metal (M. N. Kozicki, M. Ynn, L. Hilt, A. Singh, Electrochemical Society Proc., volume 99-13, (1999), 298; M. N. Kozicki, M. Yun, S. J. Yang, J. P. Aberouette, J. P. Bird, Superlattices and Microstructures, volume 27, No. 5/6 (2000), 485-488; and R. Neale, "Micron to look again at non-volatile amorphous memory", Electronic Engineering Design (2002)).

Solid electrolytes may be crystalline or amorphous solids. The solid electrolytes which are used in CBRAM cells are normally composed of amorphous solids, which can also be referred to as amorphous matrices or glasses (G. Saffarini, Phys. Stat. Sol (A), 170, 23 (1998)). The solid electrolytes are very particularly preferably chalcogenide compounds, in particular chalcogenide glasses (see M. N. Kozicki, loc. cit., R. Neale, loc. cit.).

Chalcogenides are compounds in which one or more elements from the sixth main group in the periodic table (oxygen, sulfur, selenium, tellurium) form the more electronegative components, which are referred to as oxides, sulfides, selenides and tellurides. Sulfides and selenides have a pronounced tendency to form amorphous solids. They are thus used with particular preference for the production of CBRAM cells. Oxides can likewise be produced as amorphous layers, but their structure (microstructure) is in general so dense that the ionic mobility of the metallic component is too low. Sulfides and, in particular, selenides have a more open microstructure and are thus preferable from the aspect of switching speed in CBRAM cells. One problem, however, is that the non-oxidic chalcogenide compounds have insufficient thermal stability with respect to the crystallization.

Germanium from the fourth main group in the periodic table can be used as a more electropositive chemical element in the chalcogenide compounds. These so-called IV-VI compounds are suitable for use as amorphous matrices for CBRAM memory cells, with germanium sulfide and germanium selenide representing particularly preferred IV-VI compounds for use as amorphous matrices in CBRAM memory cells. Alternatively, however, silicon selenide or silicon sulfide are also suitable for use as amorphous matrices for CBRAM memory cells.

The selenium content in germanium selenide $Ge_xSe_{1-x}$ and the sulfur content in germanium sulfide $Ge_xS_{1-x}$ can be varied over a wide range. Particularly highly suitable glasses with ideal characteristics are obtained when x is in the range from 0.1 to 0.5 and is, for example, 0.33. In an entirely general form, x must have a value such that the corresponding selenide or sulfide can easily form a stable glass, which is able to conduct solid ions. All selenide and sulfide glasses are referred to in the following text as Ge—S and Ge—Se chalcogenide compounds, irrespective of the respective value of x.

Under the influence of an electrical field, the metal which is contained in the amorphous matrix which forms the active material of the CBRAM memory cell, in particular in the chalcogenide glass, forms cations which migrate through the amorphous matrix to the cathode under the influence of this field. One particularly highly suitable metal is silver (Ag). Silver is highly electrically conductive in the metallic state. It can easily be ionized and, in the ionized state (as $Ag^+$) has the required mobility in the amorphous matrix of the chalcogenide glass, so that it easily migrates to the cathode, in order to be reduced to metal there. The amount of silver which can be absorbed by Ge—Se and Ge—S compounds depends on the quantity ratio Ge/S or Ge/Se. This saturation concentration is normally a few tens of percent by atomic weight and is, by way of example, 47.3 percent by atomic weight of silver for $Ge_{0.2}Se_{0.8}$ (M. N. Kozicki, M. Mitkova, J. Zhu, M. Park, C. Gopalan, loc. cit.).

The cathode is typically composed of an inert metal, such as aluminum or tungsten. The cathode can also be composed of tantalum, titanium, refractory materials, such as conductive oxides, nitrides, of nickel or of heavily n-doped or heavily p-doped silicon, or alloys of the stated materials.

The anode is a metal or a chemical compound whose cations are able to migrate as ions through the solid electrolyte. The anode is preferably composed of a metal which is also contained in the solid electrolyte. In consequence, the amount of metal which is deposited electrochemically on the cathode can be replenished by oxidation of the anode. It is thus particularly preferable to use an anode composed of silver or of silver compounds, such as $Ag_2S$, $Ag_2Se$, Ag—Al—S, Ag—Al—Se.

Solid electrolytes, such as the preferred Ge—Se—Ag glasses and Ge—S—Ag glasses which conduct ions over a wide temperature range, can be produced by photolytic dissolving of silver in a thin layer of the solid electrolyte. (Kozicki, M. N.; Mitkova M., Zhu, J.; Gopalan, C. "Can Solid State Electrochemistry Eliminate the Memory Scaling Quandary?", loc. cit.).

Before an electrical voltage is applied for the first time, the resistance between the anode and the cathode of the CBRAM memory cell is high. The high resistance value is associated with the off state or the logic 0, and can be read by suitable readers. Application of a small voltage, of typically a few 100 mV, between the cathode and the anode of the memory cell switches the CBRAM memory cell to a state which is characterized by a considerably lower value of the electrical resistance, with this value in some cases being several powers of ten lower. The metal of the anode is oxidized during a switching process. The cations that are formed migrate through the solid electrolyte to the cathode area, where they are reduced to metal again. A metallic or metal-rich phase is electrochemically deposited in or on the solid electrolyte. In consequence, the cathode is electrically conductively connected to the anode. This process, which is referred to as "Conductive Bridging", gives CBRAM memory cells their name.

This state of the memory cell, which is characterized by the considerably lower electrical resistance, is associated with the on state or the logic 1. Like the off state (the logic 0), it can be read by determining the cell resistance.

CBRAM memory cells are non-volatile memory media. The low-resistance (highly conductive) state and the high-resistance state of the memory cell are both maintained even without any power being supplied, at room temperature.

Storage in CBRAM cells is reversible. The metal that has been deposited on the inert cathode (now the anode) is dissolved again with oxidation by application of a voltage of similar magnitude but with an opposite mathematical sign, that is to say the cathode becomes the anode, and the anode becomes the cathode, and migrates in the form of cations back through the solid ion conductor to the reactive anode (now the cathode). The conductive bridge is thus interrupted, so that the CBRAM cell reverts to the high-resistance state. This deletion process takes place just as quickly as the writing process (switching to the low-resistance state). These write/delete cycles can be repeated virtually indefinitely.

CBRAM cells represent an alternative of major interest to the memory cells that have been known in the past and can be used to overcome the problems outlined further above. However, the electrical characteristics and the thermal stability have not been completely satisfactory in the past.

A first problem is that the memory cells have an excessively high electrical resistance in the low-resistance, that is to say conductive, state (=on state) and very particularly in the high-resistance, that is to say considerably less conductive, state (=off state). This high resistance is disadvantageous from the design point of view for reading the CBRAM memory cells.

A second problem is that the electrical resistance in CBRAM cells rises with time and this affects, in particular, the electrically conductive on state. This reduction in the electrical conductivity leads to it becoming ever more difficult to read information that is stored in the cells (so-called "retention loss"). This can lead to the reading process lasting for an ever longer time as a result of the matching of the electrical resistance in the on state and in the off state. In the extreme, the stored information becomes unreadable.

A third problem is that the memory cells which have been investigated in the past do not have sufficient thermal stability for standard integration in a BEOL-CMOS process. The BEOL-CMOS process comprises method steps such as formation of wiring layers, contact layers (local interconnects), isolation layers and passivations. In this case, oven processes are carried out in addition to methods for deposition of layers, polishing processes and etching processes. In the oven processes, the electronic components are heated to temperatures which may typically be up to 400 to 450° C. These temperatures are too high for solid electrolytes formed from an amorphous or partially amorphous material, such as those used in CBRAM memory cells, in particular for chalcogenide glasses. The cells that are known at the moment are thus damaged at these temperatures. This is because the crystallization of the storage medium which is composed of an amorphous or partially amorphous solid electrolyte, in particular of a chalcogenide glass, starts even at considerably lower temperatures. The migration of ions in the storage medium thus becomes more difficult or impossible, resulting in failure of the memory cell.

Various investigations have been carried out into the thermal stability of chalcogenide glasses. Investigations by Saffarini have shown that the thermal stability of Ge—S—Ag glasses decreases as the silver content increases, and the tendency for conversion of the glass to a crystalline material increases (G. Saffarini, Phys. Stat. Sol. (A), 170, 23 (1998) "Experimental Studies on Ge—S—Ag Glasses"). One simple measure of the thermal stability of glasses is the difference $(T_C-T_g)$, where $T_C$ means the crystallization temperature and $T_g$ the glass transition temperature. The greater this difference, the more stable is the glass state. Saffarini carried out investigations with Ge—S—Ag glasses whose silver content was varied in 5% steps from 5 to 30 percent by atomic weight. During the process, it was found that the thermal stability of $Ge_{40}Ag_5S_{55}$ ($T_C-T_g=133$ K) decreases continuously to $Ge_{20}Ag_{30}S_{50}$ ($T_C-T_g=103$ K).

Ramesh et al. have carried out crystallization studies in germanium telluride glasses containing copper with the formula $Cu_xGe_{15}Te_{85-x}$, with x being varied in the range from 2 to 10 percent by atomic weight (Ramesh K. et al., J. Phys. Cond. Matter 8, (1996) 2755). The thermally most stable glass has the composition $Cu_5Ge_{15}Te_{80}$ ($T_C-T_g=98$ K). If the copper content is increased further (6, 8, 10 percent by atomic weight), the thermal stability of the glass decreases ever further ($T_C-T_g=90, 73, 43$ K).

A further problem with the memory cells that have been known so far is that they do not have adequate data retention at high temperatures. The electrical conductivity falls or is lost completely over time, which makes the reading of the cell more difficult, makes it take longer, or makes it impossible.

For these and other reasons there is a need for the present invention.

SUMMARY

The present invention provides a non-volatile, resistively switching memory cell. In one embodiment, the memory cell has a first electrode, a second electrode and a solid electrolyte, which is arranged such that it makes contact between the electrodes, and is composed of an amorphous or partially amorphous, non-oxidic matrix and a metal which is distributed in the amorphous or partially amorphous, non-oxidic matrix and whose cations migrate to the cathode in the amorphous matrix under the influence of an electrical voltage, wherein the solid electrolyte contains one or more further metallic materials for stabilization of the amorphous state of the matrix.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 is a diagram illustrating one exemplary embodiment of a memory cell according to the present invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention relates to non-volatile, resistively switching memory cells, which have a first electrode, a second electrode and a solid electrolyte, which is arranged such that it makes contact between the electrodes. The solid electrolyte is composed of an amorphous matrix and a metal $M_1$ which is distributed in the amorphous matrix and whose cations migrate to the cathode in the amorphous matrix under the influence of an electrical voltage, in which the memory cells can be switched by virtue of the migration of these cations by a first electrical voltage to a state with a low electrical resistance, and by a second electrical voltage of opposite polarity to a state with a high electrical resistance.

Furthermore, a second type of metal $M_2$ also exists, whose ions are not mobile in the electrolyte when an electrical field is applied to the electrolyte.

These two physical states, that is to say the state with the high electrical resistance and the state with the low electrical resistance, are used for information storage. The higher electrical resistance is normally associated with the logic 0, and the lower electrical resistance with the logic 1.

After the brief current supply has been switched off, to be precise both after the storage (transition to the state with the low electrical resistance) and deletion of information (transition to the state with the high electrical resistance), the most recently induced resistance value is maintained in a stable form for a long time. The information store in resistively switching memory cells is accordingly non-volatile.

The major increase in the conductivity of the resistively switching memory cell when a voltage is applied is based on electrochemical processes in the solid electrolyte of the memory cell, which result in deposition of a metallically conductive product which extends completely from the cathode to the anode. By application of a voltage of opposite polarity, this product is at least partially dissipated again, and the metallically conductive contact between the electrodes is interrupted: the memory cell reverts to the state with the high resistance value. Because of this storage mechanism, non-volatile, resistively switching memory cells are also referred to as non-volatile CBRAM memory cells (CBRAM=conductive bridging random access memory).

The present invention provides CBRAM memory cells in which the problems mentioned in the background no longer occur, or are at least reduced sufficiently that they do not restrict, or do not significantly restrict, the usability of the CBRAM cells. In one embodiment, the present invention improves the thermal stability of CBRAM memory cells, to influence the electrical resistance in the on state and off state, and improves the data retention and legibility of the memory cells both in terms of temperature stability and in terms of long-term stability.

In accordance with the present invention, the temperature stability and long-term stability of CBRAM memory cells which contain an amorphous solid electrolyte, in particular a chalcogenide glass in which a metal is dissolved as the active medium, can be improved by combining the metal that is involved in the switching effect with one or more additional metallic materials in the solid electrolyte, which additional metallic materials stabilize the amorphous or non-crystalline state of the solid electrolyte which is a major factor in the reversible switching effect.

In one embodiment, the present invention is a number of percentage points by atomic weight of the metal with the switching capability by the further metallic material or materials. In another embodiment, the present invention is achieved by leaving the amount of dissolved metal with a switching capability unchanged, and by introducing an additional amount of metallic material.

FIG. 1 illustrates one exemplary embodiment of a memory cell according to the present invention generally at 10. A first embodiment of the present invention thus relates to a non-volatile, resistively switching memory cell 10, which has a first electrode 14, a second electrode 16 and a solid electrolyte, which is arranged such that it makes contact between the electrodes 14, 16, and is composed of an amorphous or partially amorphous matrix 24 and a metal or a chemical compound or alloy 26 which is distributed in the amorphous or partially amorphous matrix and whose cations migrate to the cathode in the amorphous or partially amorphous matrix under the influence of an electrical voltage. The memory cell can be switched, on the basis of the migration of these cations, by a first electrical voltage to a state with a low electrical resistance and by a second electrical voltage of opposite polarity to a state with a high electrical resistance. The memory cell according to the invention further provides that the solid electrolyte contains one or more further metallic materials 28 for stabilization of the amorphous state of the matrix 24.

According to a first embodiment, the first electrode may be composed of the metal or the chemical compound or alloy which is contained, in particular dissolved, in the amorphous matrix of the solid electrolyte, and is involved in the switching effect. The metal which is distributed in the amorphous or partially amorphous matrix and is involved in the switching effect and/or the metal of which the first electrode is composed are/is particularly preferably silver or an alloy or a chemical compound, such as an alloy or a chemical compound of silver, for example $Ag_2S$, $Ag_2Se$ or an Ag—Al—S or Ag—Al—Se compound. The amorphous matrix advantageously contains more than 5 percent by atomic weight, and even better more than 10 percent by atomic weight, of the metal which is involved in the switching effect. According to the invention, the amorphous or partially amorphous matrix is particularly advantageously saturated with this metal. The saturation concentration is a number of tens of percent by atomic weight and, for example, is 47.3 percent by atomic weight of silver for the $Ge_{0.2}Se_{0.8}$ which can be used according to the invention.

The additional metallic material or materials in the amorphous matrix can likewise be involved in the switching effect. However, these are advantageously one or more metallic materials which are not involved in the switching effect. Metallic materials which are not involved in the switching effect are, in particular, those metals which do not have significant mobile ion characteristics in the amorphous or partially amorphous matrix, in particular a chalcogenide compound. The additional metallic material may be one or more metals or alloys of these metals.

According to one embodiment of the invention, the amorphous or partially amorphous matrix can particularly contain copper and/or aluminum as the metallic material or metallic materials, which ensure thermal and/or long-term stabilization of the amorphous matrix of the solid electrolyte.

The major effect of the additional metallic material or materials is to stabilize the amorphous state or glass state of the matrix of the solid electrolyte during the normal process temperatures, and thus to prevent the phase transition from an amorphous phase to a crystalline phase, which cannot be used for the switching process. Apart from copper and aluminum, any other metallic material or any other metallic alloy component can be used for this purpose which forms a fast chemical bond and/or has a high melting point. An undisturbed chemical bond is in this case a major factor in order on the one hand to improve the rigidity and/or the cross-linking of the amorphous matrix, such as a chalcogenide glass, and thus the thermal stability of the layer, and on the other hand to suppress undesirable diffusion of this additional metal component or these additional metal components, in the form of thermal or ionic diffusion, or diffusion induced in any other way.

The second electrode (that is to say the cathode for electrochemical switching from the high-resistance to the low-resistance state) of the resistively switching memory cells according to the invention is preferably composed of an inert material, such as aluminum, tungsten, Ta, Ti, conductive oxides, conductive nitrides, nickel or heavily n-doped or heavily p-doped silicon. In this case, the expression an inert material means a conductive material which conducts electricity under the influence of an electrical field but does not form cations, or whose cations have no mobility, or only insignificant mobility, in the amorphous matrix when an electrical field is applied. According to a further preferred, advantageous embodiment, the amorphous matrix or the glass of the solid electrolyte may be a germanium sulfide compound, a germanium selenide compound, a silicon sulfide compound or a silicon selenide compound, in particular a germanium sulfide compound with the formula $Ge_xS_{1-x}$, a germanium selenide compound with the formula $Ge_xSe_{1-x}$, in which x is in the range from 0.1 to 0.5 and, for example, is close to 0.33, or a $Ge_wSi_xS_ySe_z$ compound, in which w, x, y and z are in the range from 0 to 1 and the sum of w+x+y+z is equal to unity.

The additional metallic component may be deposited at the same time as the amorphous material, such as the chalcogenide compound, on the electrode, or may be contained in the chalcogenide layer. The additional metallic component may be supplied by co-deposition of the various components, for example co-sputtering of Ge—S/Cu or Ge—Se/Cu. A plurality of sputter targets, for example a Ge—S or Ge—Se sputter target or a Cu sputter target, can be used for co-sputtering. As an alternative, it is possible to use a sputter target which is composed of a ternary compound, such as a CuGeS or CuGeSe compound. Aluminum or a copper/aluminum alloy can be used instead of copper. The metal which is involved in a switching process can then be introduced into the glass layer that has been stabilized in this way.

The layer of the solid electrolyte which contains one or more additional metallic materials can also be applied to the electrode of the CBRAM memory cell by different layer deposition methods, such as CVD (chemical vapor deposition), ALD (atomic layer deposition), PLD (pulsed laser deposition), spray deposition, spin coating, co-evaporation. Methods in which it is possible to deposit thin layers in a controlled way and in which low deposition temperatures are used are preferable, for example ALD or PECVD methods.

A further alternative is first of all to produce the layer of the glass component, for example the binary, ternary or quaternary chalcogenide compound (such as Ge—Se, Ge—S, Si—S, Si—Se, Ge—Se—S, Si—Se—S, Ge—Si—S, Ge—Si—Se, Ge—Si—S—Se), and then to apply the metal that is responsible for the switching effect together with the metallic material or materials which can be used for the stabilization of the amorphous matrix. This is done by applying a binary, ternary or even higher-component metallic layer composed of these metals and metallic materials to the layer composed of the amorphous matrix. By way of example, a binary Ag—X alloy layer can be sputtered on after the production of the binary, ternary or quaternary chalcogenide compound, in which X means the metallic material or materials which stabilizes or stabilize the amorphous matrix. The content of the additional metallic component can be fixed by suitable choice of the original material, for example the sputter target. Examples for sputter targets composed of an alloy with which the content of additional metallic materials in the solid electrolyte can be set are targets which are composed of $Ag_{90}Cu_{10}$, $Ag_{95}Cu_5$, $Ag_{90}Al_{10}$, $Ag_{95}Al_5$ or $Ag_{90}Cu_5Al_5$. Once this layer composed of the metal (Ag) and the metallic material (Cu and/or Al) has been applied, the activation or conditioning is carried out, for example with the metal or the metallic material in the amorphous matrix being dissolved by UV exposure or by subsequent thermal treatment, forming the stabilized solid electrolyte.

A second embodiment of the invention relates to the use of one or more metallic materials for thermal and/or long-term stabilization of the amorphous or partially amorphous matrix of the solid electrolyte in a non-volatile, resistively switching memory cell.

A third embodiment of the invention relates to the methods described in the main claims for production of non-volatile, resistively switching memory cells, which contain one or more metallic materials which stabilizes or stabilize the amorphous or partially amorphous matrix of the solid electrolyte of the memory cell with respect to thermal influences and/or in the long term.

The invention will be described in the following text with reference to two exemplary embodiments.

EXAMPLE 1

A first electrode composed of tungsten is deposited in a first method step. This electrode is inert and is thus not involved in the electrochemical processes in the finished CBRAM memory cell. A layer composed of Ge—Se—Al is then deposited on the tungsten electrode by co-sputtering of a Ge—Se—Al target in a second method step. This results in a GeSe glass which is stabilized by Al against thermal loads. A thin layer which contains mobile ions of the $M_1$ type is applied in the third method step and is then dissolved in the GeSe chalcogenide glass by exposure to UV light, forming a solid electrolyte. The second electrode, which is composed by way of example of silver or a silver compound, is applied in the final method step. The finished CBRAM memory cell comprises a reactive electrode containing silver and an inert tungsten electrode, between which a Ge—Se glass is arranged, containing, dissolved in it, silver for the switching effect and aluminum for stabilization of the amorphous matrix.

EXAMPLE 2

A first electrode composed of aluminum is deposited in a first method step. This electrode is inert and is thus not involved in the electrochemical processes in the finished CBRAM memory cell. A GeS layer is then deposited on the aluminum electrode by sputtering of a GeS target in a second method step. This results in the GeS chalcogenide glass. An $Ag_{95}Cu_5$ target is sputtered in the third method step, thus resulting in the application of a thin silver/copper layer, which is then dissolved in the GeS chalcogenide glass by subsequent thermal treatment, forming the solid electrolyte. The second electrode, which is composed of or contains silver, is applied in the final method step. The finished CBRAM memory cell comprises a reactive silver electrode and an inert aluminum electrode, between which a GeS glass is arranged, which contains silver for the switching effect and copper for stabilization of the phase.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A non-volatile, resistively switching memory cell comprising:
    a first electrode;
    a second electrode; and
    a solid electrolyte configured to make contact between the first electrode and the second electrode, wherein:
        the solid electrolyte includes an at least partially amorphous, non-oxidic matrix and a first metallic material distributed in the matrix, the first metallic material having cations that, as part of a switching effect, migrate to a cathode in the matrix under the influence of an electrical voltage, and
        the solid electrolyte contains aluminum for stabilization of an amorphous state of the matrix.

2. The memory cell of claim 1, wherein the first electrode is composed of a metal which is involved in the switching effect and is contained in the solid electrolyte.

3. The memory cell of claim 1, wherein the first electrode represents a chemical compound of the solid electrolyte.

4. The memory cell of claim 1, wherein the first metallic material, which is involved in the switching effect, comprises one or more metals from a group consisting of silver, sodium, lithium, indium and tin, a chemical compound of silver such as $Ag_2S$, $Ag_2Se$ or an Ag—Al—S— or Ag—Al—Se— compound.

5. The memory cell of claim 4, wherein the chemical compound of silver is one of a group consisting of $Ag_2S$, $Ag_2Se$ or an Ag—Al—S— or Ag—Al—Se— compound.

6. The memory cell of claim 1, wherein the amorphous material of the solid electrolyte is a material from a group consisting of binary germanium sulfide compound, a germanium selenide compound, a silicon sulfide compound or a silicon selenide compound, or is a ternary or quaternary composition of Ge, Si, Se and S.

7. The memory cell of claim 6, wherein the germanium sulfide compound corresponds to the formula $Ge_xS_{1-x}$ and the germanium selenide compound corresponds to the formula $Ge_xSe_{1-x}$, in which x is in the range from 0.1 to 0.5.

8. The memory cell of claim 7, wherein the germanium sulfide compound corresponds to the formula $Ge_xS_{1-x}$ and the germanium selenide compound corresponds to the formula $Ge_xS_{1-x}$, in which x is 0.33.

9. The memory cell of claim 1, wherein the second electrode comprises an electrically conductive, inert material.

10. The memory cell of claim 9, wherein the second electrode is composed of a material which is selected from a group consisting of aluminum, tungsten, tantalum, titanium, conductive oxides, conductive nitrides, nickel or heavily doped n-type silicon, heavily doped p-type silicon, or compounds thereof.

11. A CBRAM memory cell comprising:
    a first electrode;
    a second electrode; and
    a solid electrolyte configured to make contact between the first electrode and the second electrode, wherein:
        the solid electrolyte includes an at least partially amorphous, non-oxidic matrix and a first metallic material distributed in the matrix, the first metallic material having cations that migrate to a cathode in the matrix under the influence of an electrical voltage, and
        the solid electrolyte includes aluminum configured to provide stabilization of an amorphous state of the matrix.

12. The memory cell of claim 11, wherein the first electrode is composed of a metal which is involved in a switching effect of the CBRAM and is contained in the solid electrolyte.

13. The memory cell of claim 11, wherein the first electrode represents a chemical compound of the solid electrolyte.

14. The memory cell of claim 11, wherein the amorphous, non-oxidic matrix of the solid electrolyte comprises a material from a group consisting of binary germanium sulfide compound, a germanium selenide compound, a silicon sulfide compound or a silicon selenide compound, or is a ternary or quatenary composition of Ge, Si, Se and S.

15. The memory cell of claim 14, wherein the germanium sulfide compound corresponds to the formula $Ge_xS_{1-x}$ and the germanium selenide compound corresponds to the formula $Ge_xSe_{1-x}$, in which x is in the range from 0.1 to 0.5.

16. The memory cell of claim 14, wherein the germanium sulfide compound corresponds to the formula $Ge_xS_{1-x}$ and the germanium selenide compound corresponds to the formula $Ge_xSe_{1-x}$, in which x is 0.33.

17. The memory cell of claim 11, wherein the second electrode comprises an electrically conductive, inert material.

18. The memory cell of claim 17, wherein the second electrode comprises a material selected from a group consisting of aluminum, tungsten, tantalum, titanium, conductive oxides, conductive nitrides, nickel or heavily doped n-type silicon, heavily doped p-type silicon, or compounds thereof.

19. A non-volatile, resistively switching memory cell comprising:
    a first electrode;
    a second electrode; and
    means for providing a solid electrolyte configured to make contact between the first electrode and the second electrode, the solid electrolyte comprising:
        an at least partially amorphous, non-oxidic matrix,
        a first metal distributed in the matrix and having cations that migrate to a cathode in the matrix under the influence of an electrical voltage, and
        aluminum for stabilization of an amorphous state of the matrix.

* * * * *